(12) United States Patent
Henson et al.

(10) Patent No.: US 7,282,933 B2
(45) Date of Patent: Oct. 16, 2007

(54) PROBE HEAD ARRAYS

(75) Inventors: Roy John Henson, Pleasanton, CA (US); John M. Long, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/028,940

(22) Filed: Jan. 3, 2005

(65) Prior Publication Data

US 2006/0145713 A1    Jul. 6, 2006

(51) Int. Cl.
*G01R 31/02*    (2006.01)
(52) U.S. Cl. .............. 324/754; 324/757; 324/758
(58) Field of Classification Search ......... 324/761–762
See application file for complete search history.

(56) References Cited

U.S. PATENT DOCUMENTS 4,837,622 A    6/1989    Whann et al.
5,210,485 A *  5/1993    Kreiger et al. ............. 324/758
5,568,054 A * 10/1996    Iino et al. .................. 324/760
5,623,214 A    4/1997    Pasiecznik, Jr.
5,642,054 A    6/1997    Pasiecznik, Jr.
5,818,249 A   10/1998    Momohara
6,714,828 B2   3/2004    Eldridge et al.
6,729,019 B2   5/2004    Grube et al.
2001/0015652 A1  8/2001  Eldridge et al.

* cited by examiner

Primary Examiner—Minh N. Tang
(74) Attorney, Agent, or Firm—N. Kenneth Burraston

(57) ABSTRACT

A probe head for testing devices formed on a semiconductor wafer includes a plurality of probe DUT (device under test) arrays. Each device under test includes pads that are urged into pressure contact with probes in a corresponding probe DUT array. The probe arrays patterns have discontinuities such as indentations, protuberances, islands and openings that are opposite at least one device when the probes contact the pads.

20 Claims, 19 Drawing Sheets

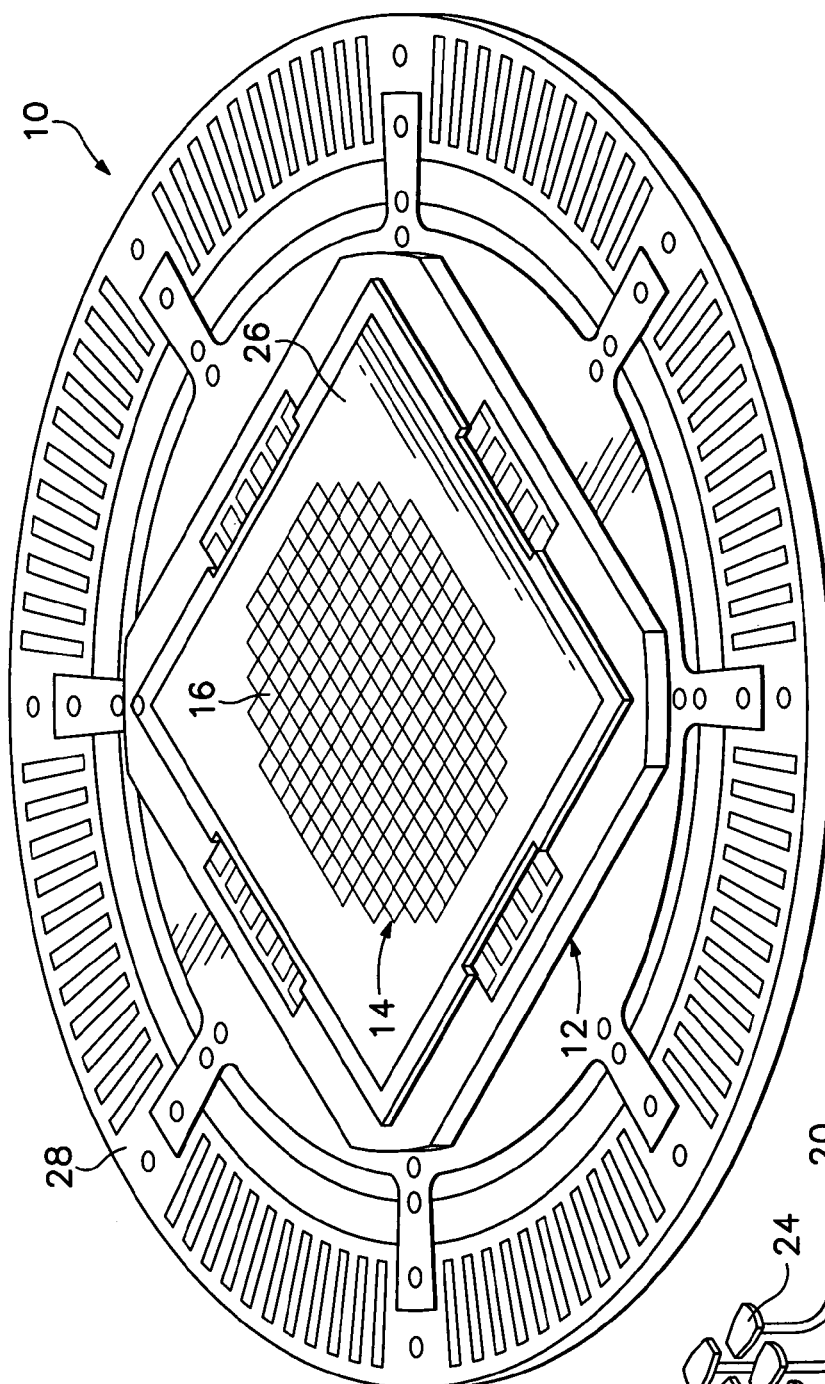
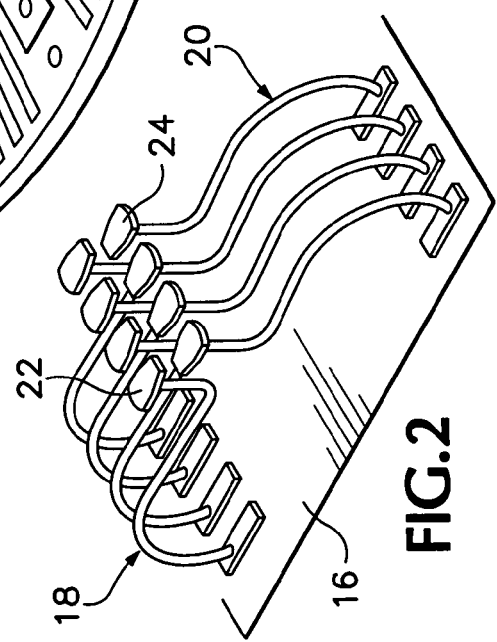

PROBE HEAD ARRAYS

FIELD OF THE INVENTION

The present invention relates to a probe head array for testing devices on a semiconductor wafer.

DESCRIPTION OF THE RELATED ART

Semiconductor devices, such as microprocessors, DRAM, and flash memory, are fabricated in a well known manner on a semiconductor wafer. Depending upon the size of the wafer and of each device formed thereon, there may be only a few or more than a thousand devices on a single wafer. These devices are typically identical to one another, each including a plurality of conductive pads on the surface thereof for power and other connections to the devices such as input signals, output signals, control signals and the like.

It is desirable to test the devices on the wafer to determine which are fully functional, and therefore suitable for packaging and sale, and which are inoperative or partially functional, and therefore unsuitable for packaging. To this end, wafer testers apply power and input signals to the devices and monitor outputs during a predetermined testing routine while the devices are still on the wafer.

Because each device under test (DUT) is substantially identical to the others, there are a plurality of identical probe DUT arrays. Each probe DUT array includes probes that make discrete pressure connections to separate ones of the pads on a corresponding DUT.

These probe DUT arrays make up a single probe array that is mounted on a probe head, or multiple probe heads which are part of the wafer probe card. The wafer probe card typically includes multiple channels, one for each DUT array on the probe head. As a result, multiple DUT arrays simultaneously contact multiple DUTs on the wafer.

Obviously, the more DUTs that can be simultaneously tested, the faster the entire wafer can be tested. But there is a limit to the number of tester channels that can be connected to the DUT arrays. While some testers contain many channels, e.g., 128 channels, there may be several hundred DUTs on the wafer to be tested. The testing process consequently includes urging the probe DUT arrays into pressure contact with the pads on a first corresponding set of DUTs (i.e. a first "touchdown"), performing the test, lifting the probes from the DUTs, moving the probes relative to the wafer, bringing the probes into contact with pads on another set of DUTs (i.e. a second "touchdown"), and testing additional DUTs. This process is repeated until all the DUTs on the wafer are tested.

The testing process described above is highly time sensitive due to the cost of the test equipment being tied up during testing. In other words, if testing could be speeded up, the production cost of finished semiconductor devices could be reduced as well. It is consequently desirable to minimize probe array touchdowns per wafer, multiple probe touchdowns per DUT, and stepping distance between touchdowns. The total number of touchdowns on a wafer is a function of how many DUT arrays are on the probe head (which in turn is often a function of how many channels the test equipment has), how many DUTs are on the wafer, and the relative configurations of the wafer DUTs and the DUT arrays. Because each testing routine takes time to run, lowering the total number of touchdowns reduces the test time for the wafer. Touchdowns typically vary between one or two on the low end to about nine on the high end.

Multiple DUT touchdowns occur when a probe DUT array is brought into contact with a particular DUT more than once. Put differently, there may be some overlap between the DUTs already tested and the probe DUT arrays as they are urged against the wafer for the second and subsequent touchdowns. It is desirable to limit the number of touchdowns for each DUT to as few as possible, preferably one. This is because when the probes are urged against the contact pads, the pads are scrubbed. Repeated scrubbing can damage the pads to the point where the DUT cannot be packaged properly. It is obviously undesirable for the testing process to damage a fully functional DUT. In addition, testing efficiency increases as the number of touchdowns decrease.

Finally, it is also desirable to minimize the stepping distance, which is the amount of relative lateral movement of the probe array and the wafer between touchdowns. Doing so further reduces the time required to completely test all the DUTs on the wafer. Touchdowns per wafer, multiple touchdowns, and stepping distance will be described in more detail with reference to the drawings.

It would be advantageous for a probe head to provide lower touchdown per wafer, lower multiple touchdowns per DUT, and reduced stepping distance.

BRIEF DESCRIPTION OF THE DRAWINGS

FIG. 1 is a perspective view of a probe card having a probe head mounted thereon.

FIG. 2 is a significantly enlarged view of a portion of a probe DUT array on the probe head of FIG. 1.

DETAILED DESCRIPTION OF THE PREFERRED EMBODIMENTS

Figure 3:
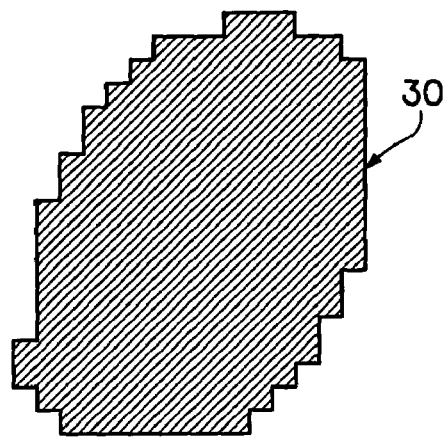
FIG. 3 is a schematic depiction of a prior art configuration of probe DUT arrays on a probe head.

Turning now to FIGS. 1 and 2, indicated generally at 10 in FIG. 1 is a probe card that includes a probe head 12. Probe card 10 can be used to carry either a prior art probe head or a probe head constructed in accordance with the present invention. The probe head includes a probe array 14 that is made up of a plurality of probe DUT arrays, like probe DUT array 16, represented schematically by squares formed in probe array 14.

Each of the probe DUT arrays, like probe DUT array 16, includes a pattern of probes, like probes 18, 20 in FIG. 2. The probes in FIG. 2 make up only a portion of the probes in probe DUT array 16. Each DUT array, like DUT array 16, may include 60 to 80 or more probes like those shown in FIG. 2. Because the wafer to be tested typically includes DUTs that are identical to one another, including the pad configuration on each DUT, the probe DUT arrays that make up probe array 14 are each also identical to one another. Each of the probes includes a tip, like tip 22 on probe 18 and tip 24 on probe 20. As will be soon described, during wafer testing, probes in probe array 14 are positioned opposite a wafer and the probe head and wafer are moved together until the probe tips, like tips 22, 24, contact corresponding pads on the DUTs on the wafer. The probes are preferably manufactured as described in U.S. Pat. No. 5,974,662 which is incorporated herein by reference.

Probe array 14 is mounted on a space transformer 26. The space transformer comprises a multi-layer ceramic substrate that includes a ground plane and a power plane connected to the appropriate probes in each probe DUT array for applying power to each DUT during testing.

The probes in the array are connected via different ones of the layers in the space transformer to contacts (not visible) on a round printed circuit board 28. As is known in the art, this connection may be made via an interposer disposed between space transformer 26 and circuit board 28. There may be as many as several thousand such connections. The contacts on printed circuit board 28 are used to connect each probe DUT array, like probe DUT array 16, to the contacts that make up a channel on a tester (not shown). The DUT configuration on each wafer can vary as a result of a number of different factors, e.g., different manufacturers, different products, different testers, different wafer sizes, etc. As a result, probe heads must be designed according to the wafer DUT pattern that results from these factors. A more detailed description of a wafer prober test setup can be found in U.S. Published Application No. 2004/0130312, incorporated herein by reference.

Figure 4:
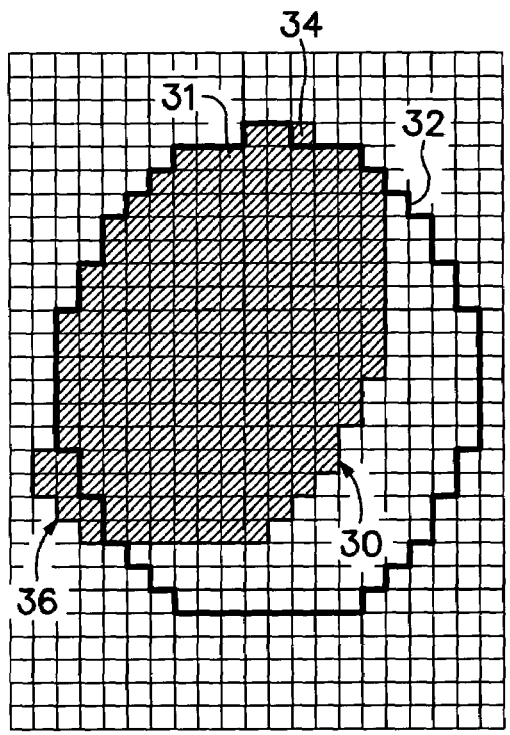
FIG. 4 shows the probe DUT arrays of FIG. 3 during a first touchdown on a wafer having a plurality of DUTs, each being represented schematically by a square within a bold line that represents the perimeter of the DUTs on the wafer.
Figure 5:
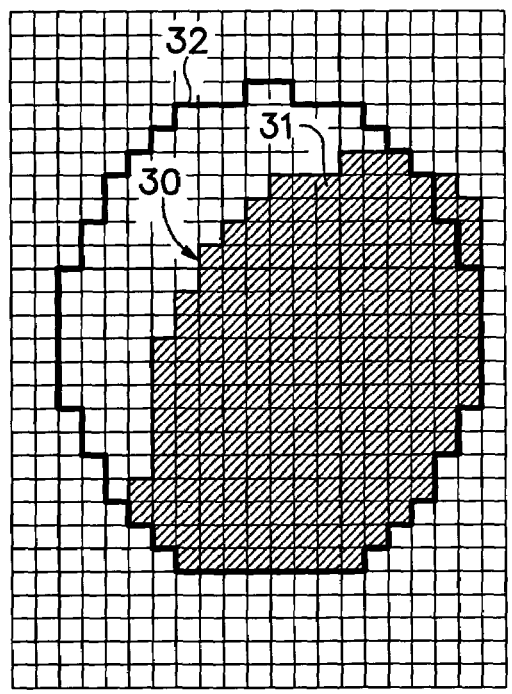
FIG. 5 is a view similar to FIG. 4 showing the probe DUT arrays during a second touchdown.

Turning now to FIGS. 3-5, a prior art probe array configuration 30 is indicated by hatched lines. Probe array 30 is formed on a space transformer (not shown in FIG. 3) in the same manner that probe array 14 is formed on space transformer 26 in FIG. 1. Each of the squares contained within the shape made by probe array 30 corresponds to a different probe DUT array, like probe DUT array 31, with all of the probe DUT arrays together making up probe array 30. There are a total of 205 probe DUT arrays in probe array 30. The arrangement of DUTs on a semiconductor wafer in FIGS. 4 and 5 is indicated schematically by squares within a bold line that contains the DUT pattern 32, with each of the squares in DUT pattern 32 corresponding to a different DUT formed on the wafer. The circular shape of the wafer perimeter that contains the DUT pattern 32 is not shown in the drawings. As can be seen in FIG. 4, a number of the probe DUT arrays are registered with a corresponding number of DUTs on the wafer. But many of the DUTs are not registered with a corresponding DUT array. In addition, some of the probe DUT arrays, like probe DUT array 34 and several probe DUT arrays 36, extend beyond DUT pattern 32 and thus are not opposite a DUT. There are a total of 205 probe DUT arrays in probe array 30 and a total of 290 DUTs in DUT pattern 32 on the wafer.

To operate the prior art probe head having the configuration shown in FIG. 3, the probe head and the wafer are first positioned relative to one another as shown in FIG. 4 with probes on the DUT arrays opposite corresponding pads on DUTs in pattern 32. The wafer and the probes are moved toward one another until the probes make contact with pads on the DUTs. Each DUT is supplied with power from the appropriate probes and a predetermined test program is simultaneously run on each of the DUTs in pattern 32 that is opposite a DUT array. Various input signals are supplied to the DUT, and DUT outputs are monitored to confirm that the DUT is functioning as designed. After the test program runs and a determination is made as to which DUTs are fully functional and which cannot be utilized, the probe head and the wafer are separated from one another, and the probe head is stepped, i.e., moved laterally relative to the wafer, to the position of FIG. 5. Probe array 30 and the wafer are then again moved into contact with one another so that the probe tips in the array make a pressure connection against corresponding pads on the DUTs. Power is again applied and the same test procedure is run thereby testing the remaining DUTs on the array. As can be seen by comparing FIGS. 4 and 5, a number of DUTs in the central portion of the wafer have probes urged against them during both touchdowns. In this example, the reasons why a large probe head array is not constructed so as to contact all of the DUTs on the wafer in a single touchdown include insufficient number of tester channels, size limits in the manufacture of a space transformer 26 (shown in FIG. 1), and yield issues when populating space transformer 26 with probes 18,20 (shown in FIG. 2). In this particular instance, the bottom three rows of the wafer shown in FIG. 4 cannot be contacted because the currently available space transformer 26 is not large enough.

Figure 6:
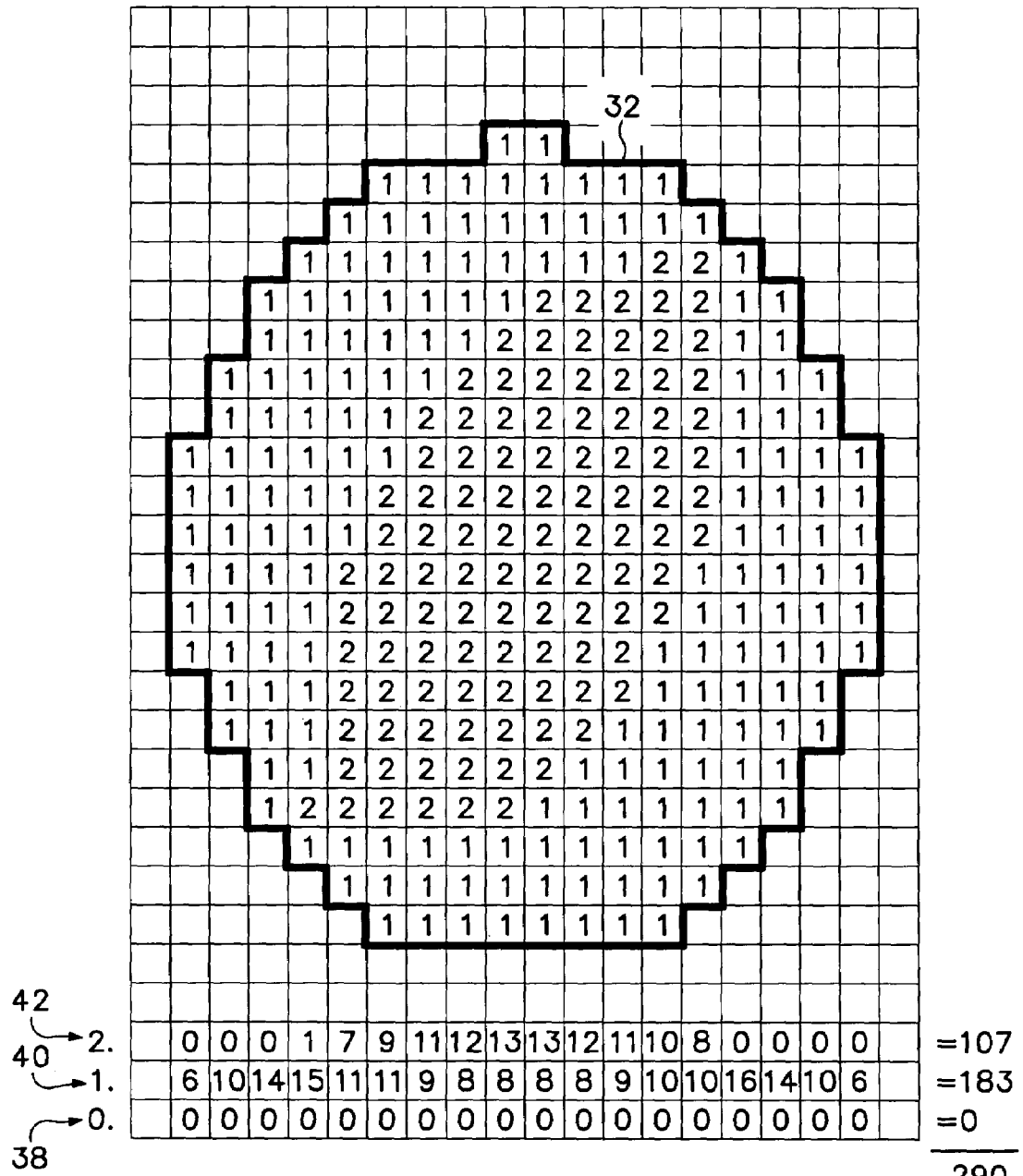
FIG. 6 is an enlarged version of the DUT configurations shown in FIGS. 4 and 5 illustrating the number of touchdowns per DUT.

The graphical depiction of FIG. 6 quantifies the number of DUTs that are subject to a single contact or touchdown from a probe DUT array and those that are subject to two touchdowns. Each DUT, depicted by a square in DUT pattern 32, includes either the numeral 1 or 2 thereon. The DUTs that have the numeral 1 were subject to only one touchdown as a result of the application of probe array 30 as depicted in FIGS. 4 and 5 while the DUTs bearing the numeral 2 were subject to two touchdowns.

The numbers in rows 38, 40, 42 in FIG. 6 indicate DUTs having 0, 1, and 2 touchdowns, respectively.

First, because it is undesirable to leave a DUT untested, none of the DUTs had zero touchdowns. As can be seen, for example, in the fifth column from the left, there is a 7 in the double-touchdown row and a 11 in the single-touchdown row. The number 7 was derived by summing the number of double touchdowns of the DUTs in the column above the numeral 7. Similarly, the 11 was derived by summing the number of single touchdowns from the DUTs in the same column. And each of the other columns of numbers is similarly derived. As a result, the sum of all of the touchdowns in row 42 equals 107, i.e., 107 DUTs on the wafer were subject to double touchdowns. Similarly, the sum of the numbers in row 40 equals 183, i.e., 183 DUTs were subject to a single touchdown. The sum of 107 and 183 equals 290 which is the total number of DUTs on the wafer.

In short, 205 probe DUT arrays test all of the DUTs on the wafer in two wafer touchdowns with 107 out of 290 DUTs being subject to double touchdowns.

Turning now to FIGS. 7-10, another prior art probe array configuration 11 is indicated by hatched lines. The same schematic representations are used in FIGS. 7-10 as in FIGS. 3-5. In other words, probe array 11 is formed on a space transformer (not shown in FIGS. 7-10), and each of the squares contained within the shape made by probe array 11 in FIGS. 8 and 9 correspond to a different probe DUT array with all of the probe DUT arrays together making up probe DUT array 11.

Figure 9:
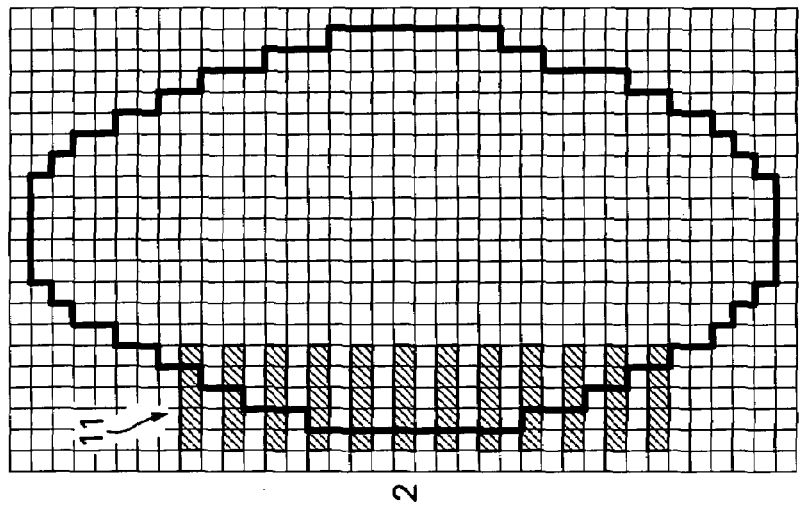
FIG. 9 is a view similar to FIG. 8 showing the probe DUT arrays during a second touchdown.
Figure 8:
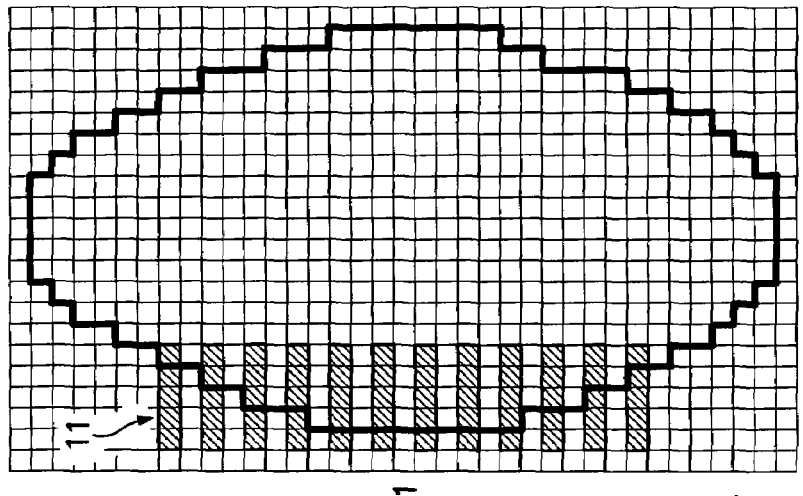
FIG. 8 shows the probe DUT arrays of FIG. 7 during a first touchdown on a wafer having a plurality of DUTs, each being represented schematically by a square within a bold line that represents the perimeter of the DUTs on the wafer.

Similarly, the arrangement of DUTs on a semiconductor wafer in FIGS. 8 and 9 is indicated schematically by squares within a bold line that contains the DUT pattern with each of the squares within the bold line corresponding to a different DUT formed on the wafer. As can be see in both FIGS. 8 and 9, a number of the probe DUT arrays are registered with the corresponding number of DUTs on the wafer. But many of the DUTs are not registered with a corresponding DUT array. In addition, some of the probe DUT arrays extend beyond the probe DUT pattern and are thus not opposite a DUT.

Figure 7:
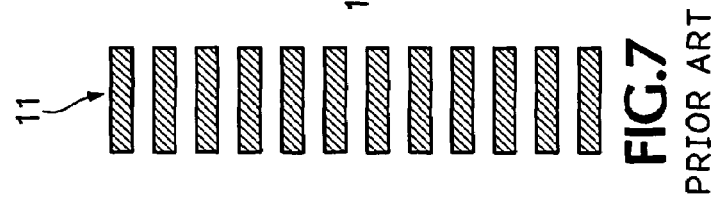
FIG. 7 is a schematic depiction of another prior art configuration of probe DUT arrays on a probe head.

To operate the prior art probe head having the configuration shown in FIG. 7, the probe head and the wafer are first positioned relative to one another as shown in FIG. 8 with probes on the DUT arrays opposite corresponding DUT pads. The wafer and probes are moved toward one another until the probes make contact with the pads. Testing proceeds as described above, and when finished, the probe head and the wafer are separated from one another, and the probe head is stepped to the position of FIG. 9. Probe array 11 and the wafer are then again moved into contact with one another for another round of testing.

Figure 10:
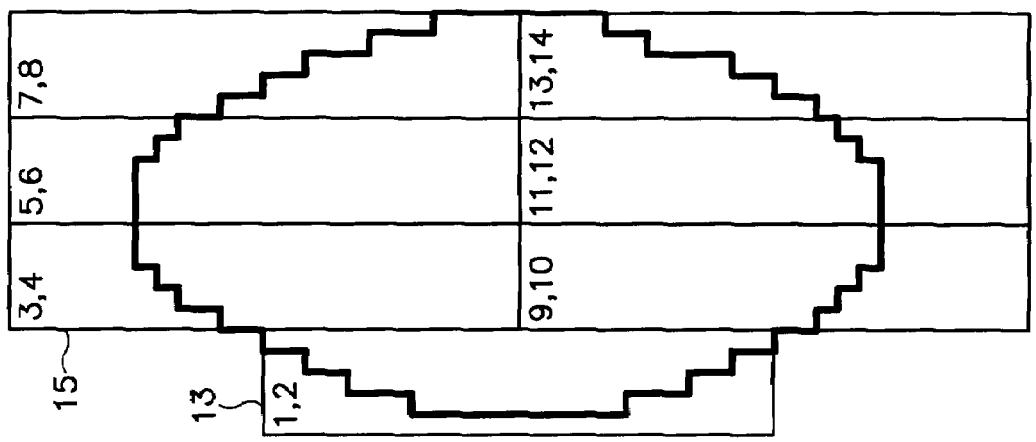
FIG. 10 is a schematic view illustrating the total number of touchdowns required to test all of the DUTs on the wafer.

The touchdowns of probe array 11 illustrated in FIGS. 8 and 9 are represented by a rectangle 13 in FIG. 10, with the numerals 1, 2 indicating the touchdowns of FIGS. 8 and 9, respectively. FIG. 10 is a schematic illustration of each of the additional touchdowns that are required to complete testing of all the DUTs on the wafer. For example, after touchdowns 1, 2, which test all of the DUTs in rectangle 13, the probe head is stepped to position 3, illustrated schematically in FIG. 10 within rectangle 15. The probe head again contacts the DUTs for testing. Thereafter, the probe array and wafer are separated from one another, the probe head is stepped down one row of DUTs, similar to the one-row step between FIG. 8 and FIG. 9, to complete testing of all the DUTs within rectangle 15.

The probe array 11 is again stepped to the rectangle bearing the numerals 5, 6, and the fifth and sixth touchdowns and testing complete of all DUTs within that rectangle. Additional stepping and testing occurs as illustrated in the rectangles of FIG. 10 until all of the DUTs are tested. As illustrated in FIG. 10, this requires a total of 14 touchdowns.

Figure 11:
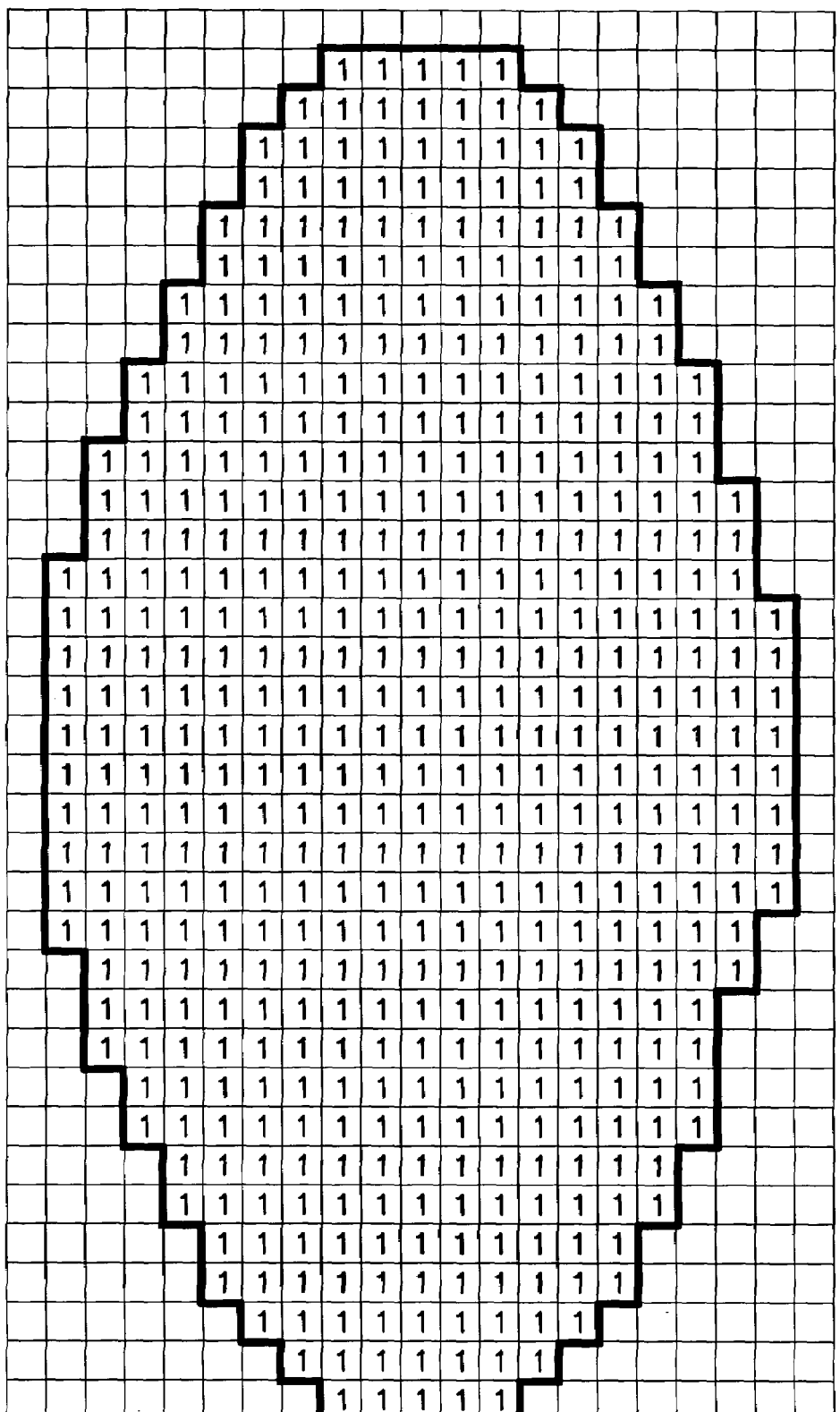
FIG. 11 is an enlarged version of the DUT configurations shown in FIGS. 8 and 9 illustrating the number of touchdowns per DUT.

A somewhat enlarged version of the DUT pattern on the wafer from FIGS. 8 and 9 is depicted in FIG. 11 with the number of touchdowns each DUT is subjected to. As can be seen, an advantageous feature of probe array 11 when used in the stepping pattern described is that each DUT is subject to only a single touchdown during testing. On the other hand, a total of 14 touchdowns are required to test all the DUTs on the wafer. This results in a relatively long time to test all of the DUTs.

Figure 15:
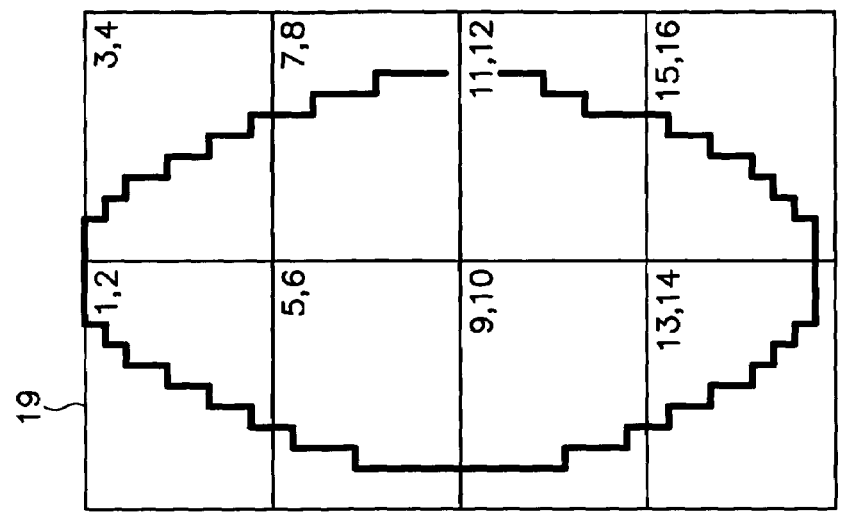
FIG. 15 is a schematic view illustrating the total number of touchdowns required to test all of the DUTs on the wafer.
Figure 14:
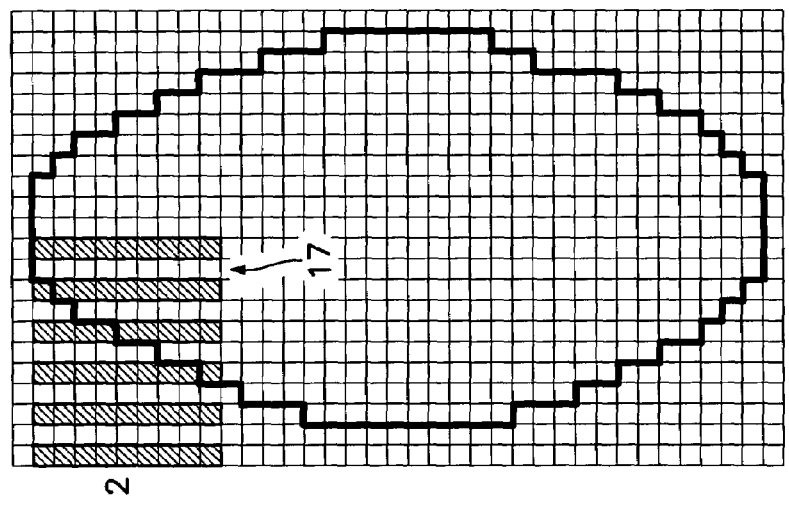
FIG. 14 is a view similar to FIG. 13 showing the probe DUT arrays during a second touchdown.
Figure 12:
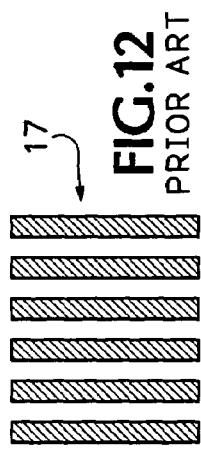
FIG. 12 is a schematic depiction of another prior art configuration of probe DUT arrays on a probe head.
Figure 13:
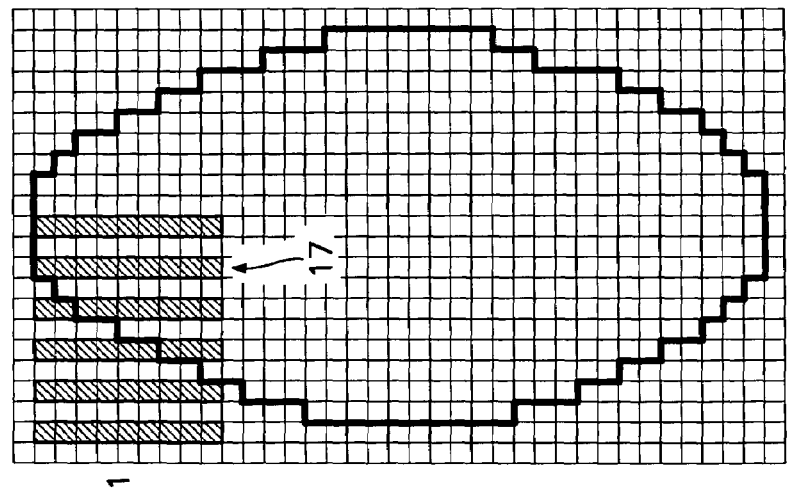
FIG. 13 shows the probe DUT arrays of FIG. 12 during a first touchdown on a wafer having a plurality of DUTs, each being represented schematically by a square within a bold line that represents the perimeter of the DUTs on the wafer.

Turning now to FIGS. 12-15, another prior art probe array 17 is depicted using the same schematic representations as in FIGS. 7-10. While FIGS. 7-10 maybe thought of as a skipped-row approach, FIGS. 12-15 comprise a similar approach but using skipped columns. For example, the first touchdown on the wafer DUTs is illustrated in FIG. 13 with the second being illustrated in FIG. 14. The step from FIG. 13 to FIG. 14 comprises a lateral shift of one column of DUTs. Steps 1, 2 are illustrated schematically in 15 via rectangle 19. As can be seen in FIG. 15, additional steps of the probe array, first to touchdown 3, and then a lateral shift of one column to touchdown 4, then to touchdown 5, another lateral shift, etc., results in testing all of the DUTs on the wafer. As illustrated in FIG. 15, this approach requires a total of 16 touchdowns.

Figure 16:
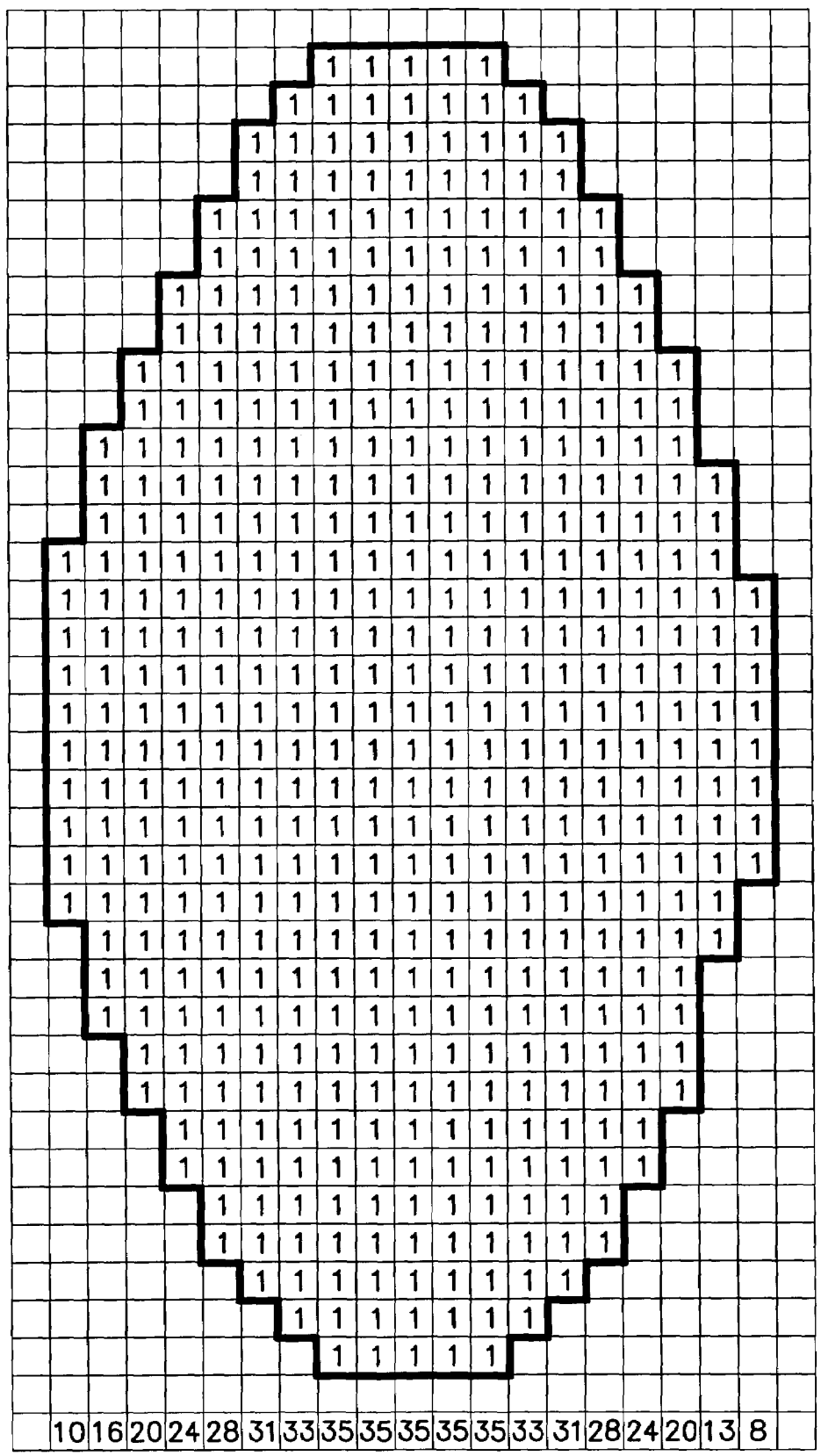
FIG. 16 is an enlarged version of the DUT configurations shown in FIGS. 13 and 14 illustrating the number of touchdowns per DUT.

Turning now to FIG. 16, a slightly enlarged version of the DUT pattern on the wafer illustrates the number of touchdowns on each DUT. As in the skipped-row probe array, each DUT is subject only to a single touchdown. But a total of 16 touchdowns are required to test all 494 DUTs on the wafer. Again, this results in a relatively long time to test all the DUTs.

Turning now to FIGS. 17-22, illustrated therein is another prior art probe array 21 and testing method. The same schematic representations are used in FIGS. 17-22 as in the previous descriptions of the prior art. Depicted here is what might be thought of as a checkerboard approach. As can be seen in FIGS. 18-21, probe array 21 touches down on a first position, shown in FIG. 18. Thereafter, it steps to the right so that each DUT array in probe array 11 is over a DUT adjacent to the one tested in the first touchdown. Next, going from the second to the third touchdown, FIG. 19 to FIG. 20, respectively, probe array 21 steps down by one DUT and one DUT array. Finally, in FIG. 21, the probe array steps one column to the left.

Figure 22:
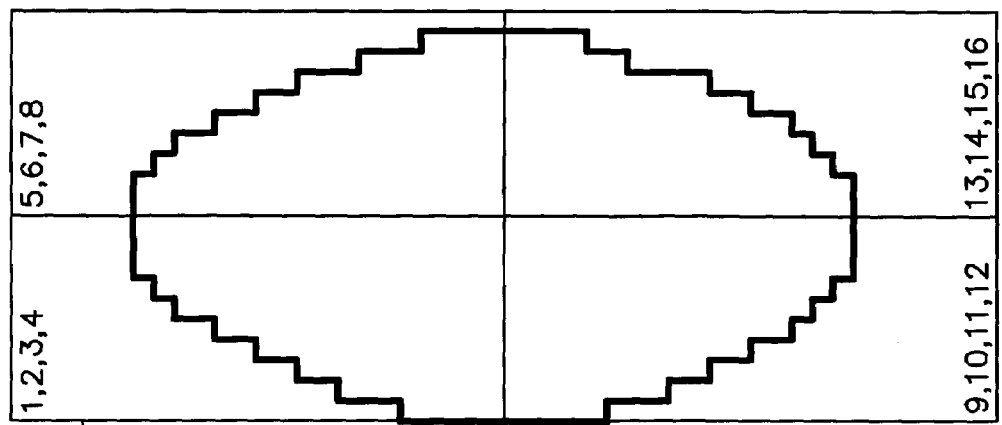
FIG. 22 is a schematic view illustrating the total number of touchdowns required to test all of the DUTs on the wafer.

With reference to FIG. 22, rectangle 23 depicts all of the four touchdowns in FIGS. 18-21. As a result of completing all four touchdowns and testing after each, all of the DUTs within rectangle 23 are tested.

Figure 18:
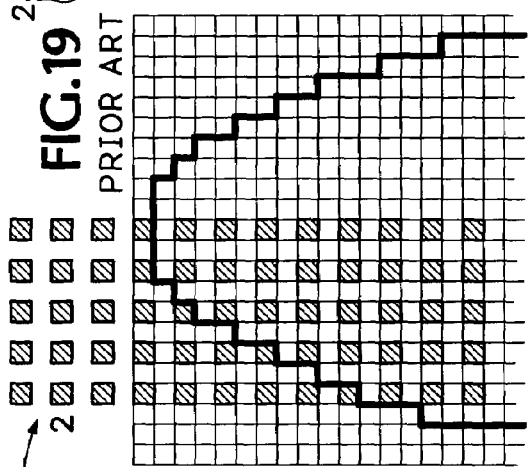
FIG. 18 shows the probe DUT arrays of FIG. 17 during a first touchdown on a wafer having a plurality of DUTs, each being represented schematically by a square within a bold line that represents the perimeter of the DUTs on the wafer.
Figure 19:
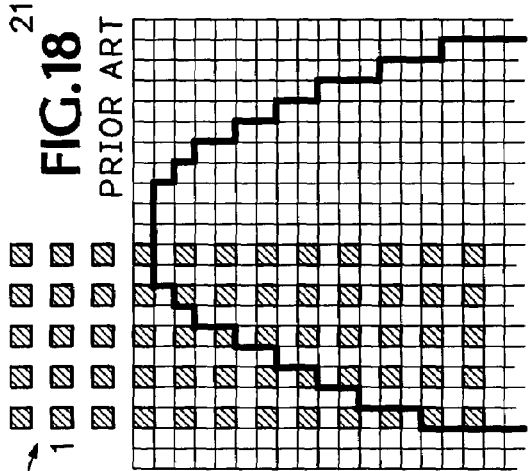
FIG. 19 is a view similar to FIG. 18 showing the probe DUT arrays during a second touchdown.
Figure 20:
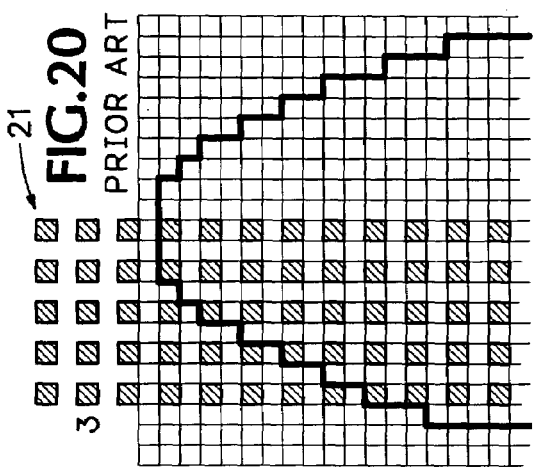
FIG. 20 is a view similar to FIGS. 18 and 19 showing the probe DUT arrays during a third touchdown.
Figure 21:
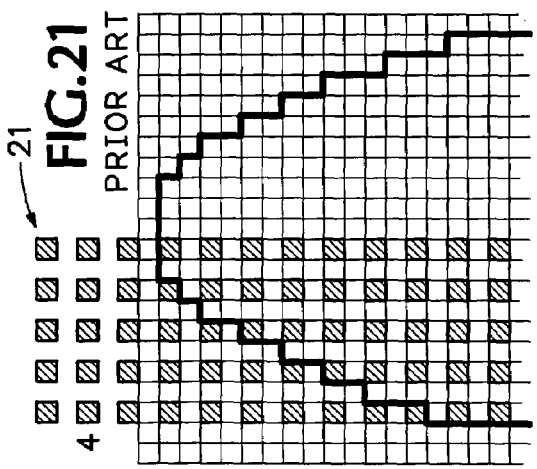
FIG. 21 is a view similar to FIGS. 18-20 showing the probe DUT arrays during a fourth touchdown.
Figure 17:
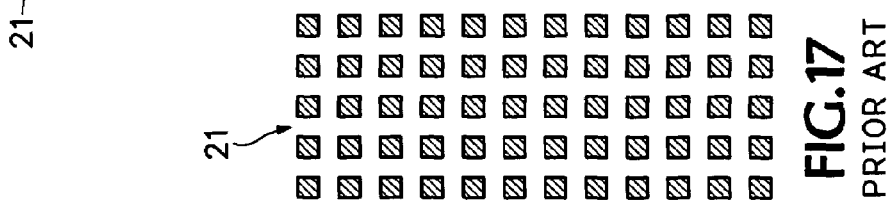
FIG. 17 is a schematic depiction of another prior art configuration of probe DUT arrays on a probe head.
Figure 23:
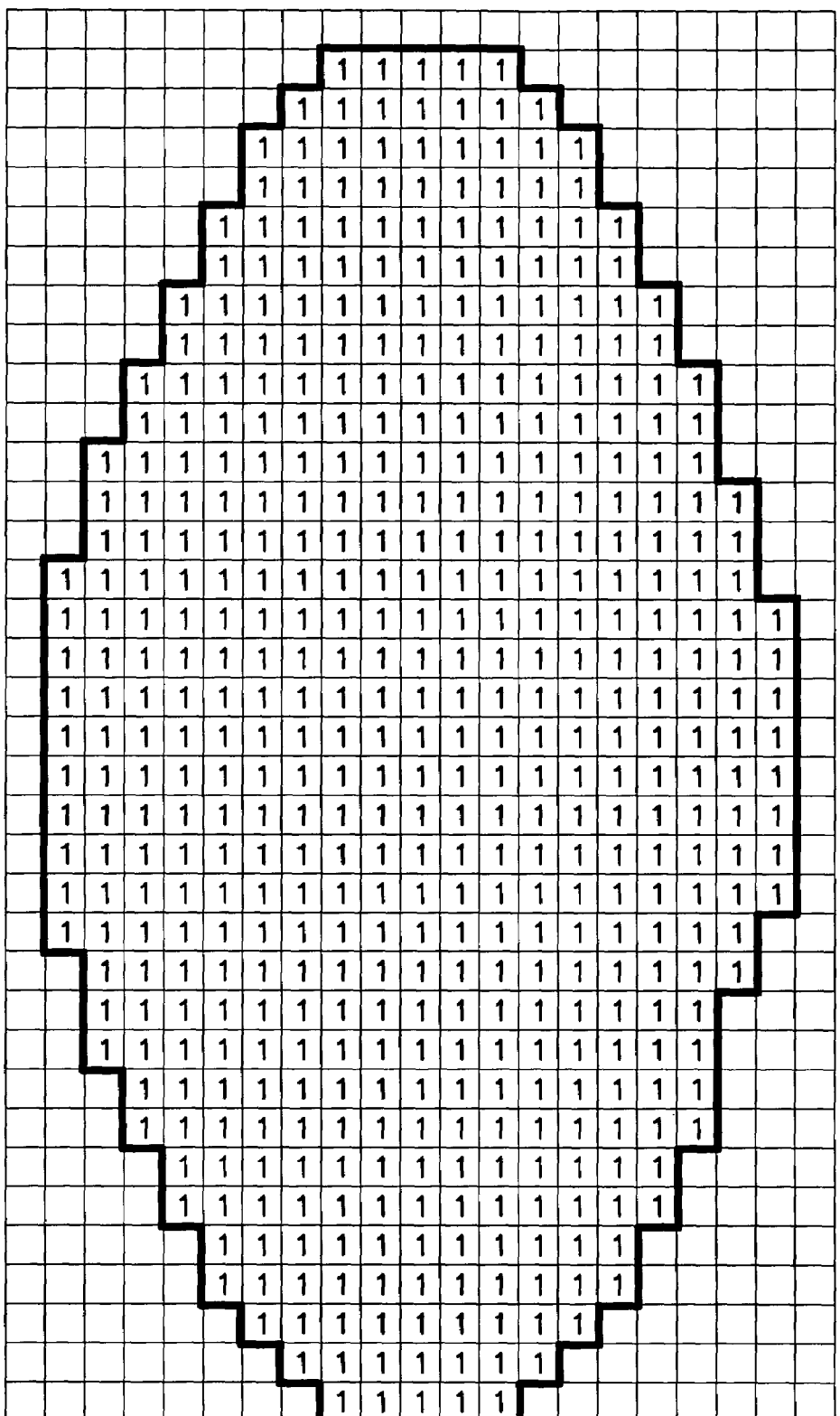
FIG. 23 is an enlarged version of the DUT configurations shown in FIGS. 18-21 illustrating the number of touchdowns per DUT.

Probe array 21 next steps to the adjacent rectangle for the fifth, sixth, seventh, and eighth touchdowns, those being similar to the touchdowns depicted in FIGS. 18-20 and resulting in testing of all the DUTs within that rectangle. Testing continues to each of the two lower rectangles in FIG. 22 through a total of 16 touchdowns, which concludes testing of all of the DUTs on the wafer. In FIG. 23, as in the previous two embodiments, all of the DUTs are tested and are subjected to only a single touchdown. But again there are a large number of touchdowns, namely 16, which creates a long testing period for the wafer.

Figure 26:
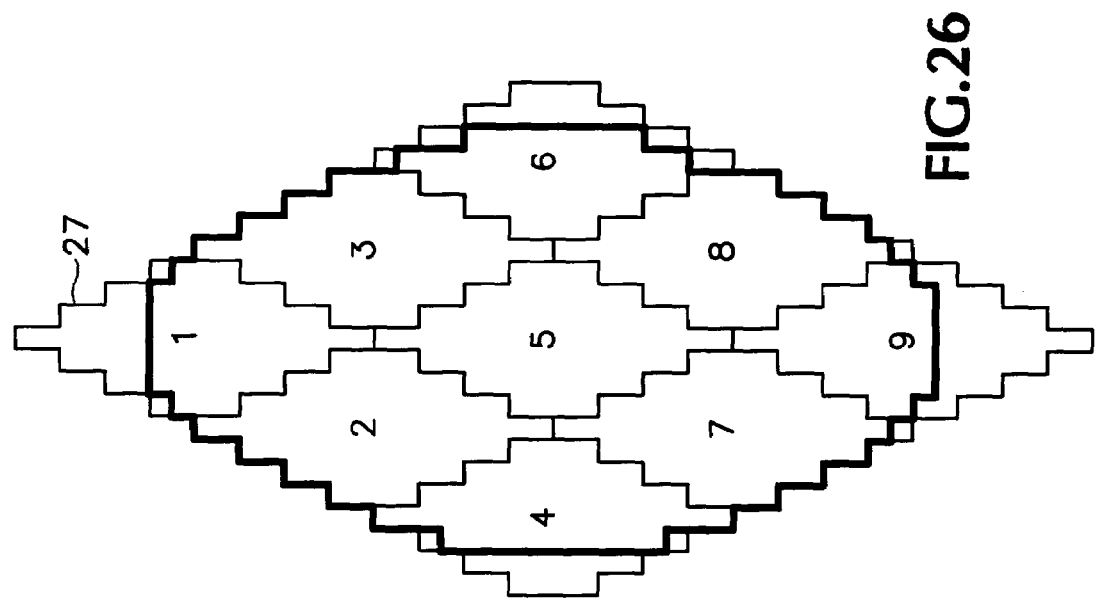
FIG. 26 is a schematic view illustrating the total number of touchdowns required to test all of the DUTs on the wafer.
Figure 25:
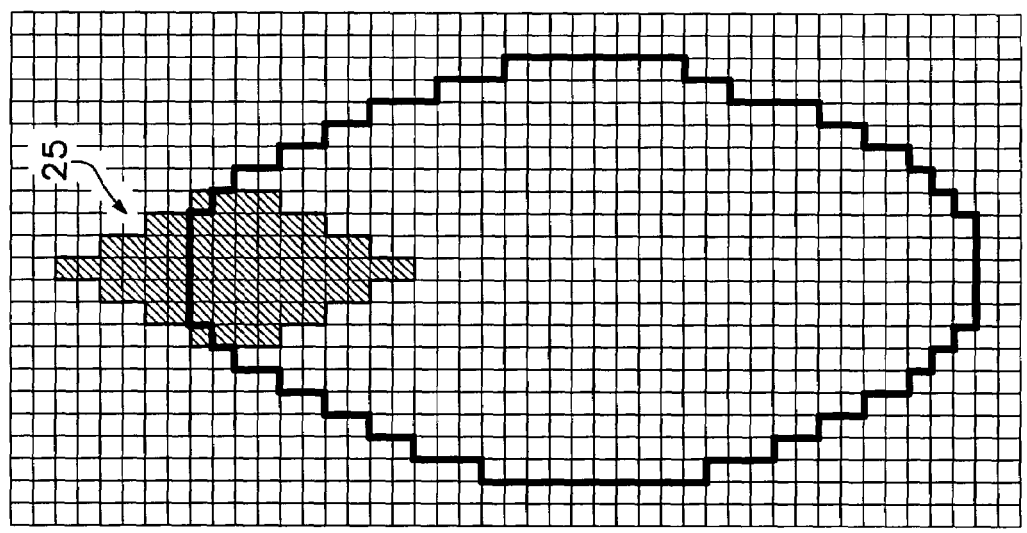
FIG. 25 shows the probe DUT arrays of FIG. 24 during a first touchdown on a wafer having a plurality of DUTs, each being represented schematically by a square within a bold line that represents the perimeter of the DUTs on the wafer.
Figure 24:
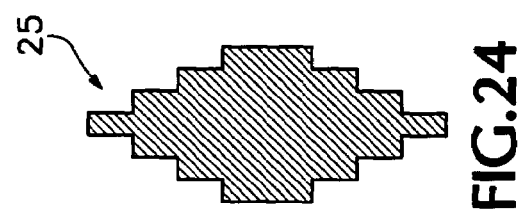
FIG. 24 is a schematic depiction of probe DUT arrays on a probe head constructed in accordance with the present invention.
Figure 27:
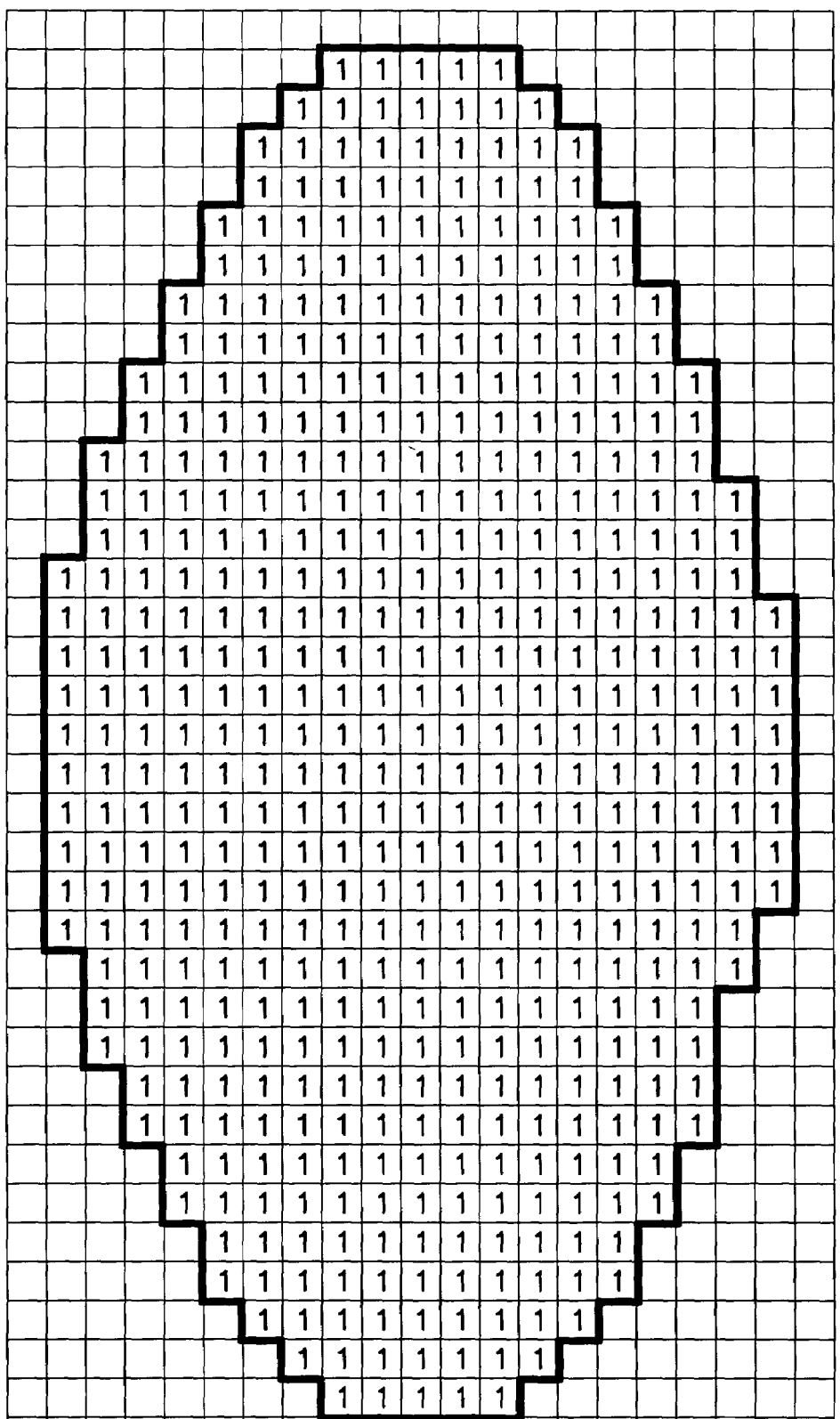
FIG. 27 is an enlarged version of the DUT configurations shown in FIG. 25 illustrating the number of touchdowns per DUT.

Turning now to FIGS. 24-26, depicted therein is a probe array 25 constructed in accordance with the present invention. Probe array 25 includes 64 DUT arrays that touch the wafer, which has the same number of DUTs in the same configuration as was illustrated with the skipped row, skipped column, and checkerboard prior art probes. Each rhombus or diamond-shaped pattern in FIG. 26, like pattern 27, represents a different touchdown of probe array 25. As can be seen in FIG. 26, a total of nine touchdowns illustrated by the correspondingly numbered patterns, like pattern 27, are required to test each of the DUTs on the wafer. As illustrated in FIG. 27, each of the DUTs is subject to only a single touchdown. But the total number of touchdowns is only nine, which is fewer than with any of the skipped row, skipped column, or checkerboard prior art probe arrays described above. For the wafer depicted in FIG. 27, a square array (not shown) comprising eight DUT arrays by eight DUT arrays (64 total DUT arrays) requires 12 touchdowns to test all the DUTs on the wafer in FIG. 27, and a rectangular array (not shown) of four DUT arrays by 16 DUT arrays (also 64 total) requires 11 touchdowns to complete testing.

Figure 28:
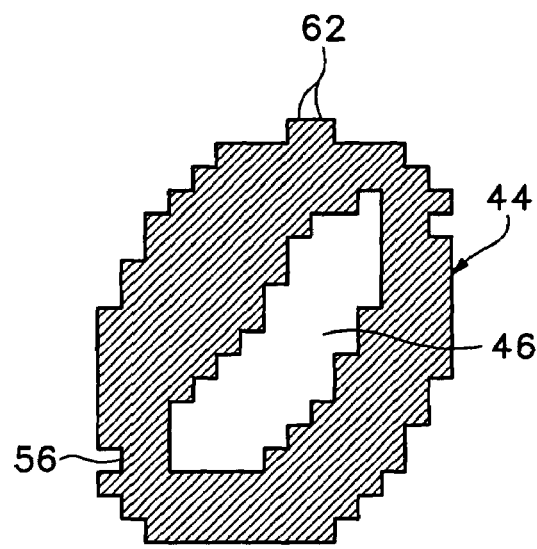
FIG. 28 is a schematic depiction of probe DUT arrays on a probe head constructed in accordance with a second embodiment of the present invention.

Turning now to FIG. 28, a probe array 44 includes a plurality of probe DUT arrays and is also constructed in accordance with the present invention. Like the previously described probe arrays, probe array 44 is formed on a space transformer as shown in FIG. 1. Probe array 44 is applied to DUTs on a wafer having the same DUT pattern as in FIGS. 4-6, i.e., the same number of DUTs located in the same configuration, namely DUT pattern 32. The configuration of probe array 44, however, is different, notably as a result of an opening 46.

Figure 29:
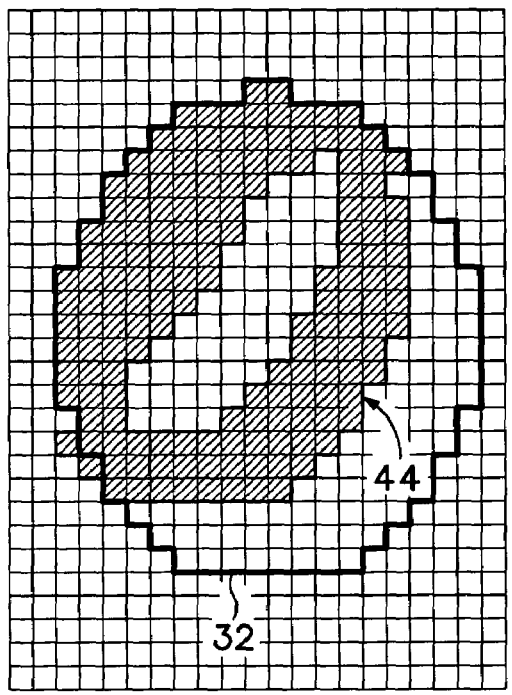
FIG. 29 shows the probe DUT arrays of FIG. 28 during a first touchdown on a wafer having a plurality of DUTs, each being represented schematically by a square within a bold line that represents the perimeter of the DUTs on the wafer.
Figure 30:
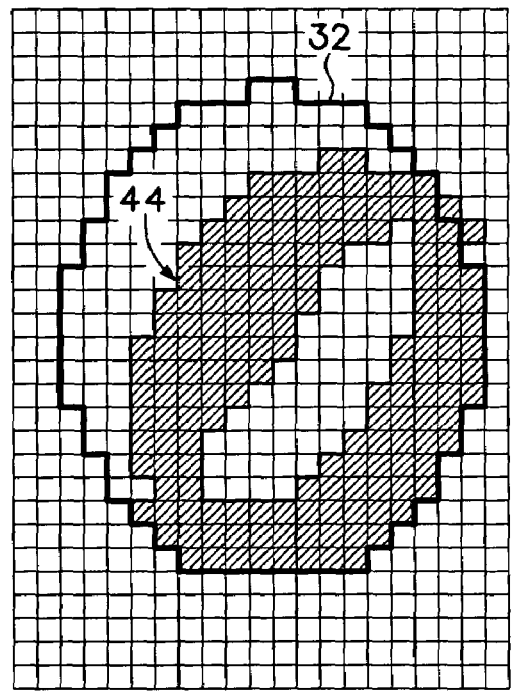
FIG. 30 is a view similar to FIG. 29 showing the probe DUT arrays during a second touchdown.

As is the case with the prior art probe head, the DUTs in DUT pattern 32 on the wafer are all tested in two touchdowns, the first being depicted in FIG. 29 and the second in FIG. 30. As can be seen in both FIGS. 29 and 30, in both touchdowns two DUT arrays are outside pattern 32. When a DUT array is outside the boundary, it is not opposite a DUT and therefore is not used. As can be seen in FIGS. 4 and 5, a total of four DUTs in the first touchdown and three DUTs in the second touchdown are outside the boundary.

Figure 31:
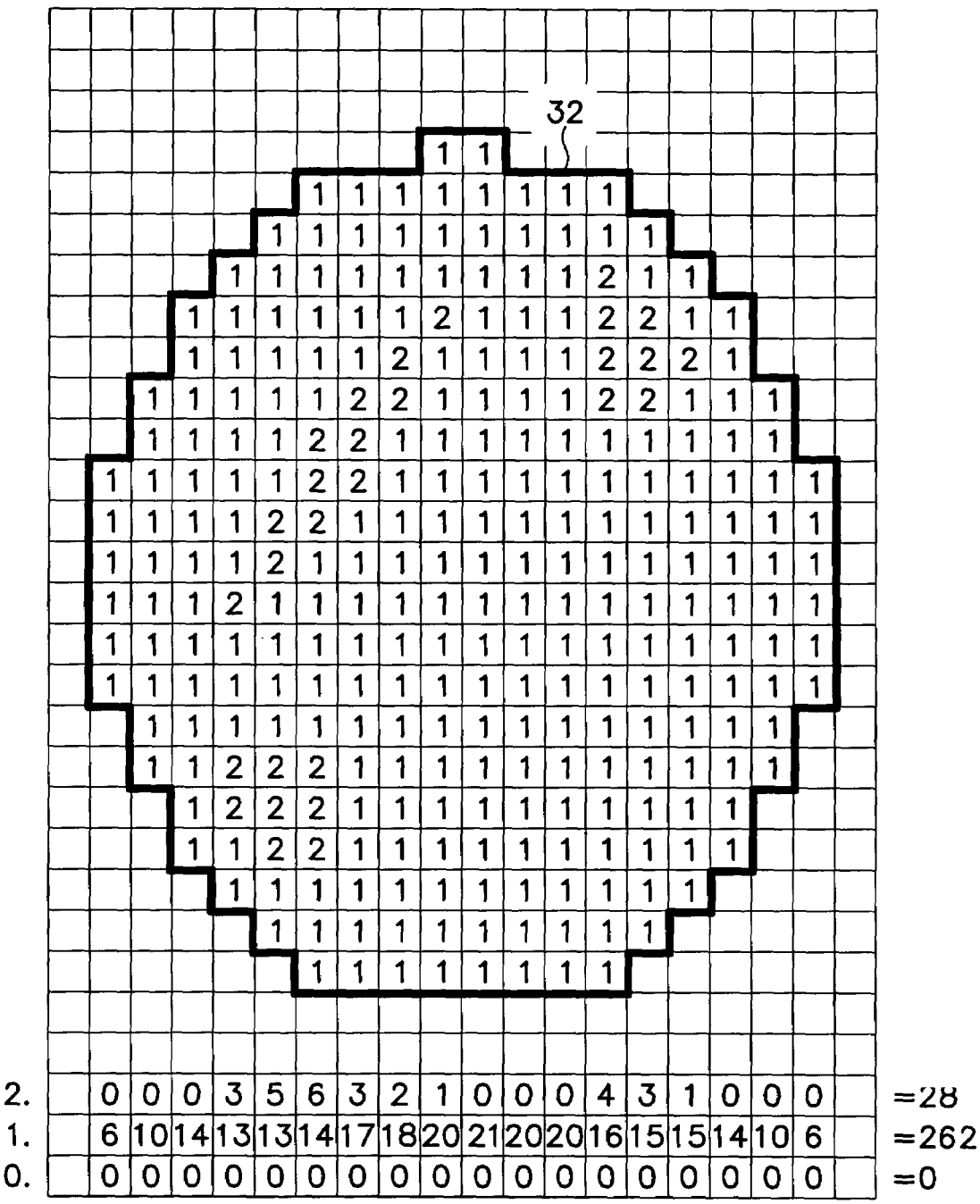
FIG. 31 is an enlarged version of the DUT configurations shown in FIGS. 29 and 30 illustrating the number of touchdowns per DUT.

In addition, as can be seen in the schematic chart of FIG. 31, there are far fewer DUTs exposed to double touchdowns than in the prior art FIG. 6 illustration. And this is all done with fewer DUT arrays, 161 DUT arrays in probe array 44 as contrasted with 205 DUT arrays in probe array 30. As a result, fewer tester channels are utilized, fewer DUT arrays are unutilized in each touchdown, and fewer DUTs are exposed to double touchdowns. These improvements increase efficiency and reduce the likelihood of damage resulting from multiple touchdowns.

Figure 36:
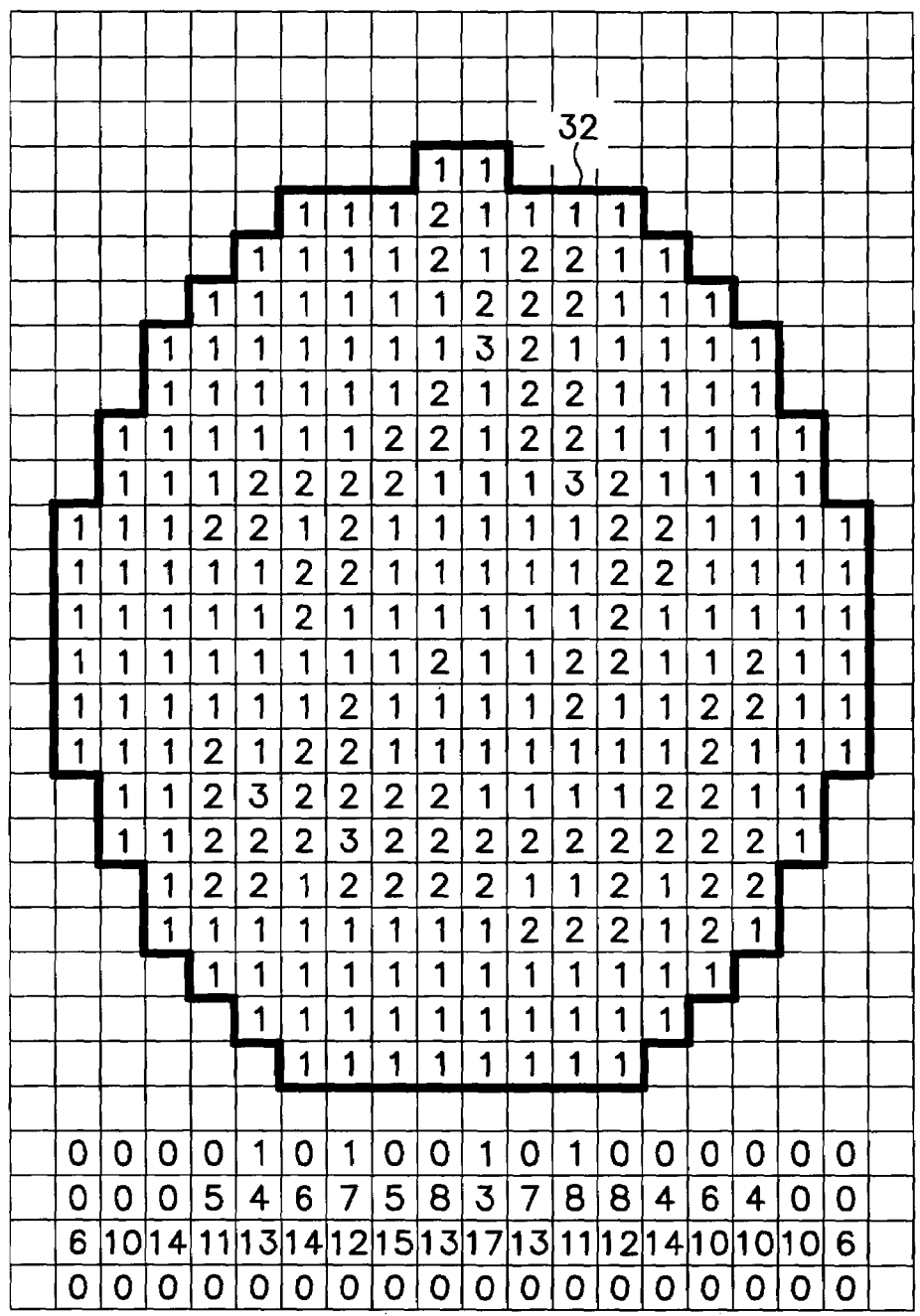
FIG. 36 is an enlarged version of the DUT configurations shown in FIGS. 33-35 illustrating the number of touchdowns per DUT.
Figure 37:
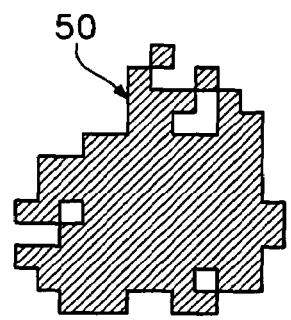
FIG. 37 is a schematic depiction of probe DUT arrays on a probe head constructed in accordance with a fourth embodiment of the present invention.

Turning now to FIGS. 32-35, another probe array 48 is constructed in accordance with the present invention and is also for use with DUT pattern 32. But because probe head 48 has only 133 DUT arrays, as contrasted with 161 DUT arrays for probe array 44, three touchdowns are necessary. The three touchdowns illustrating the respective positions of the DUT arrays and DUTs on the semiconductor wafer are depicted sequentially in FIGS. 33, 34, and 35. As can be seen in FIG. 36, there are only four DUTs subject to a triple touchdown with 75 being subject to a double touchdown and 211 to a single touchdown with all 290 DUTs being tested. While probe array 48 results in more touchdowns per wafer and in four triple touchdowns, this may still be an optimal solution where the number of tester channels are constrained to fewer than 161.

Figure 38:
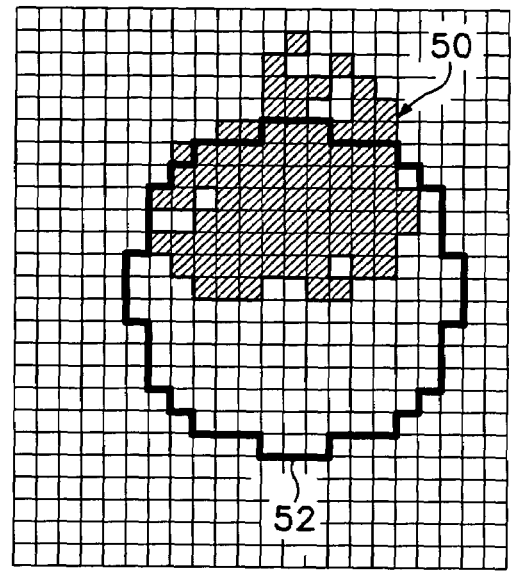
FIG. 38 shows the probe DUT arrays of FIG. 37 during a first touchdown on a wafer having a plurality of DUTs, each being represented schematically by a square within a bold line that represents the perimeter of the DUTs on the wafer.
Figure 39:
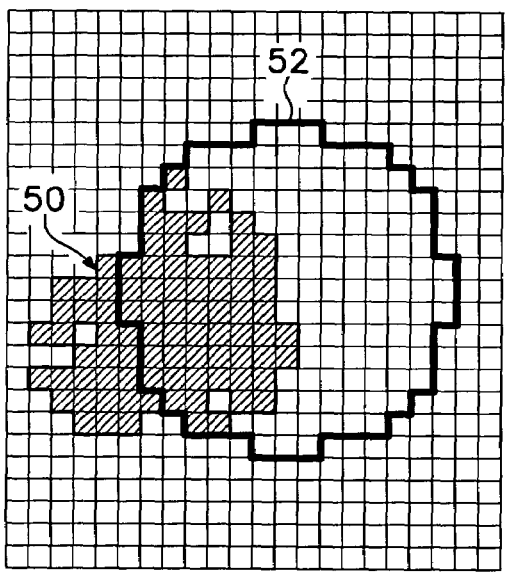
FIG. 39 is a view similar to FIG. 38 showing the probe DUT arrays during a second touchdown.
Figure 40:
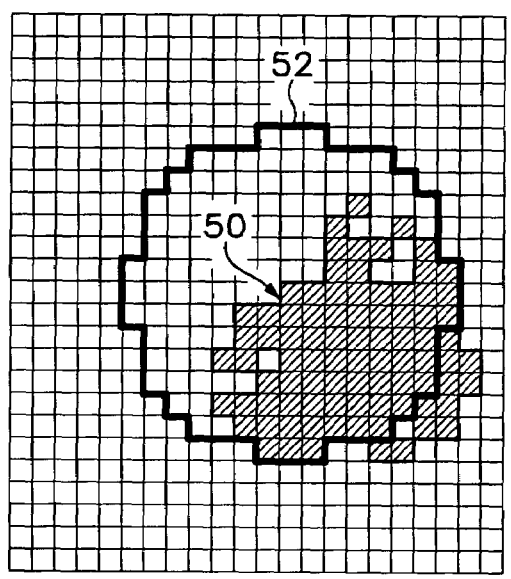
FIG. 40 is a view similar to FIGS. 38 and 39 showing the probe DUT arrays during a third touchdown.
Figure 41:
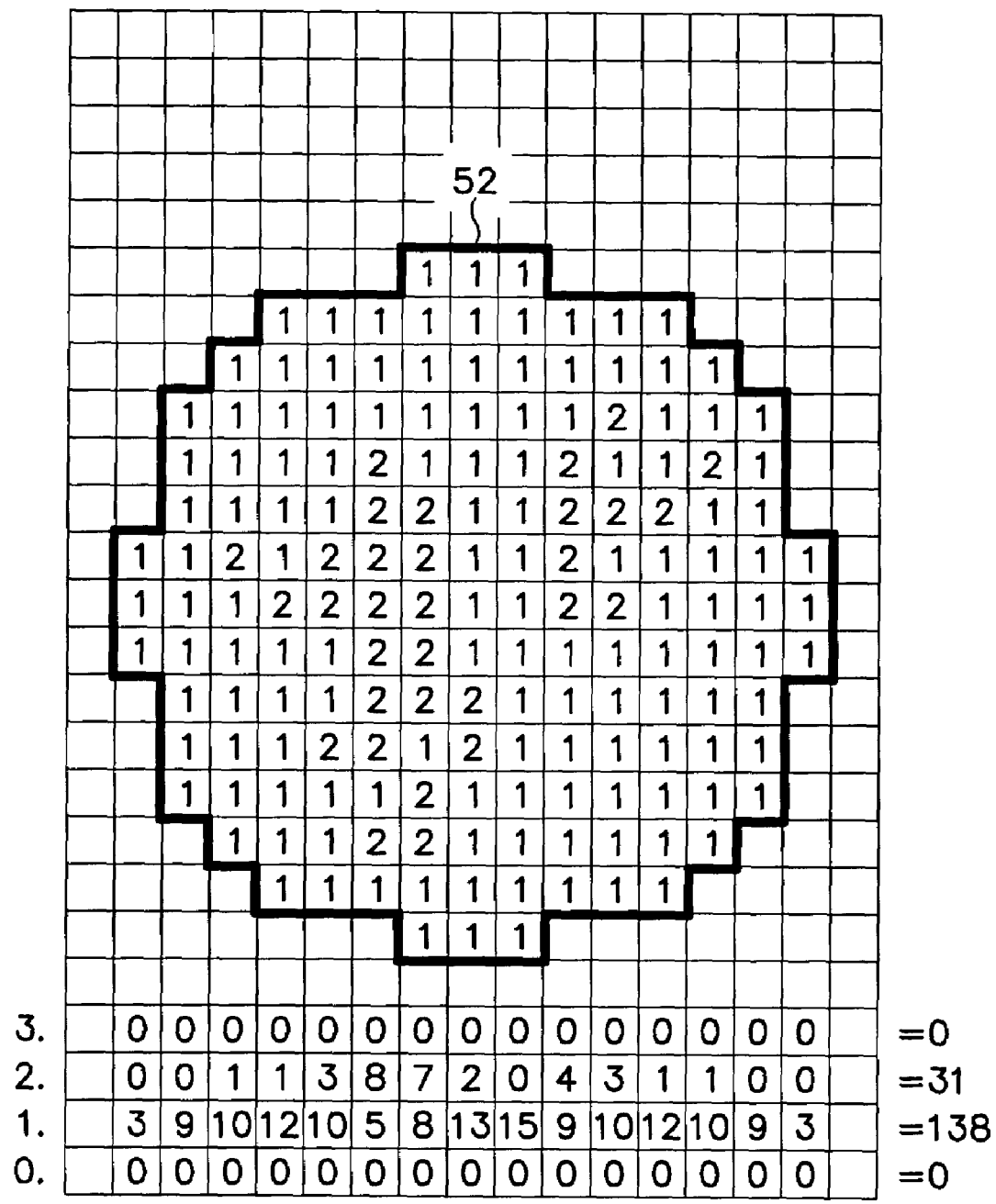
FIG. 41 is an enlarged version of the DUT configurations shown in FIGS. 38-40 illustrating the number of touchdowns per DUT.

Turning now to FIGS. 37-40, a probe array 50 is constructed in accordance with the present invention. This probe array is designed for use with a wafer having a different number of DUTs and a different configuration from the previously illustrated DUT pattern. DUT pattern 52 includes a total of 169 DUTs while probe array 50 includes a total of 85 DUT arrays. Three wafer touchdowns, depicted in FIGS. 38-40, are used to test each of the DUTs in DUT pattern 52. As can be seen in FIG. 41, while three touchdowns are used, no DUTs are subject to triple touchdowns and only 31 DUTs are subject to double touchdowns with 138 DUTs being subject to only a single touchdown.

Figure 42:
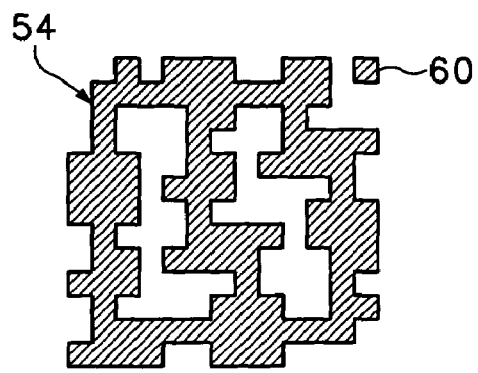
FIG. 42 is a schematic depiction of probe DUT arrays on a probe head constructed in accordance with a fifth embodiment of the present invention.
Figure 43:
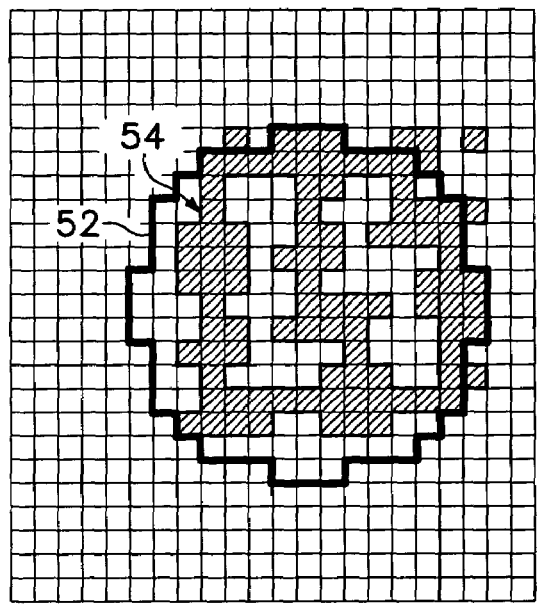
FIG. 43 shows the probe DUT arrays of FIG. 42 during a first touchdown on a wafer having a plurality of DUTs, each being represented schematically by a square within a bold line that represents the perimeter of the DUTs on the wafer.
Figure 44:
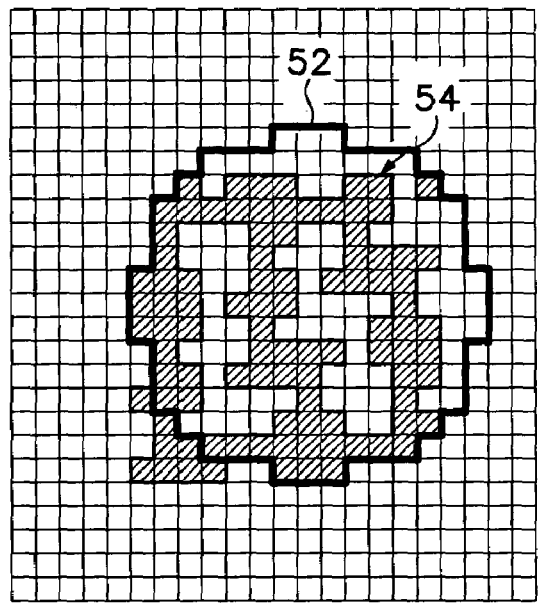
FIG. 44 is a view similar to FIG. 43 showing the probe DUT arrays during a second touchdown.
Figure 45:
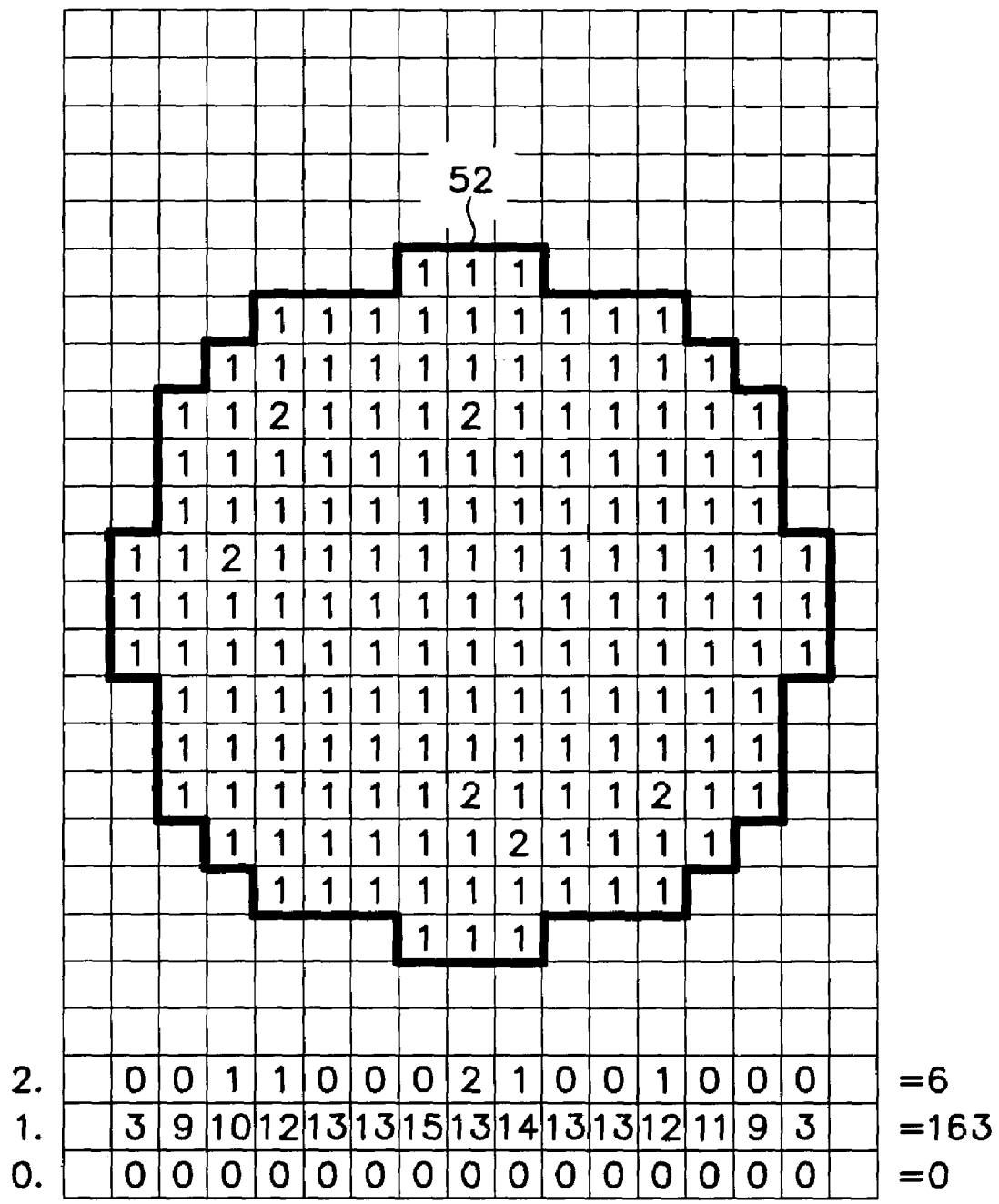
FIG. 45 is an enlarged version of the DUT configurations shown in FIGS. 43 and 44 illustrating the number of touchdowns per DUT.

In FIGS. 42-44, another probe array 54—also constructed in accordance with the present invention—is used to test the same DUT pattern 52 as illustrated in FIGS. 38-41. Here, however, there are a total of 95 DUT arrays in probe array 54. The additional number of DUT arrays permits testing of all the DUTs in DUT pattern 52 with only two touchdowns on the wafer, illustrated in FIGS. 43 and 44, as opposed to three touchdowns used by probe array 50 and illustrated in FIGS. 38-40. In FIG. 45, it can be seen that only six of the DUTs in DUT pattern 52 are subject to double touchdowns with the remaining DUTs receiving a only single touchdown. While these results are superior to those obtained by probe array 50 for the same DUT configuration, recall that probe array 50 included only 85 DUT arrays and thus might be an optimal solution if constraints, such as limited number of tester channels, prevent use of a probe array like probe array 54, which includes 95 DUT arrays.

Figure 32:
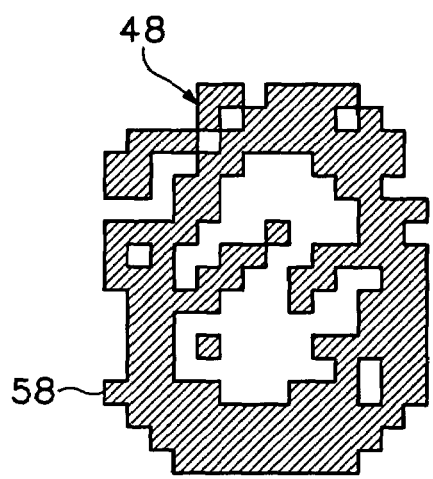
FIG. 32 is a schematic depiction of probe DUT arrays on a probe head constructed in accordance with a third embodiment of the present invention.
Figure 33:
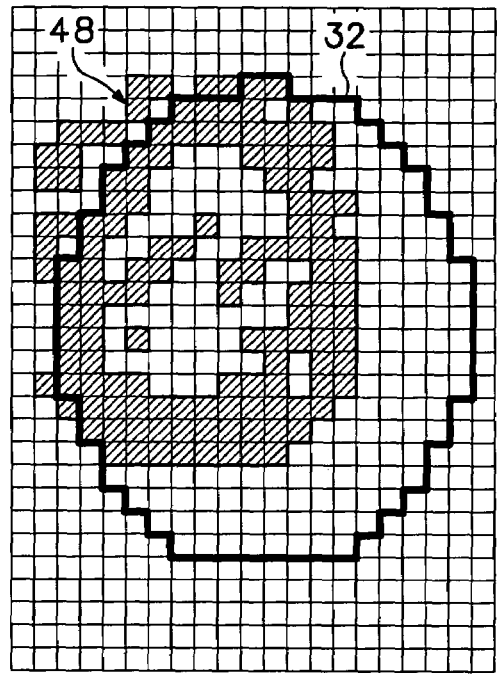
FIG. 33 shows the probe DUT arrays of FIG. 32 during a first touchdown on a wafer having a plurality of DUTs, each being represented schematically by a square within a bold line that represents the perimeter of the DUTs on the wafer.
Figure 34:
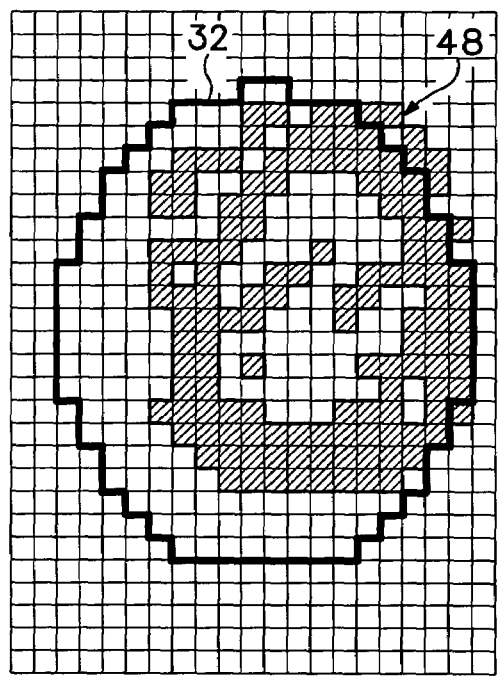
FIG. 34 is a view similar to FIG. 33 showing the probe DUT arrays during a second touchdown.
Figure 35:
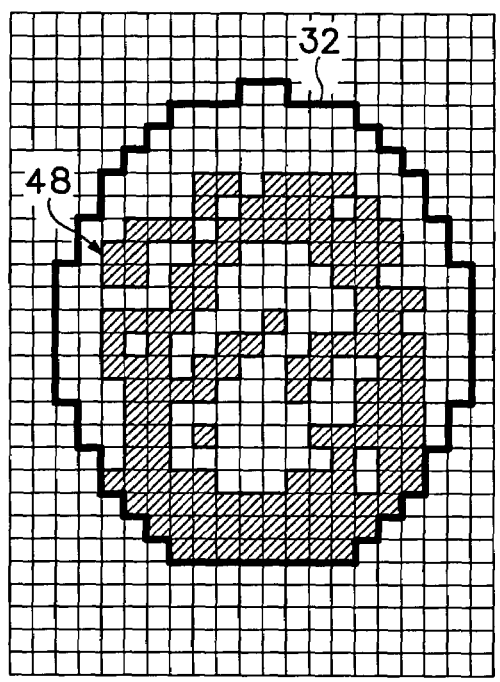
FIG. 35 is a view similar to FIGS. 33 and 34 showing the probe DUT arrays during a third touchdown.

In summary, the probe patterns disclosed above allow for fewer touchdowns per wafer, lower multiple touchdowns per DUT, reduced number of tester channels required and reduced stepping distance between touchdowns, thereby reducing cost and processing time, and increasing quality of the semiconductor dies being tested. In one aspect of the invention, the inventive patterns can be thought of as combinations of one or more discontinuities such as openings, indentations protuberances, and islands. For example, an opening 46 and an indentation 56 are shown in FIG. 28, a protuberance 58 is shown in FIG. 32, and an island 60 is shown in FIG. 42. Note that the two DUT arrays 62 at the top of pattern 44 shown in FIG. 28 are not considered protuberances since they are merely filling out the top arcuate portion of the generally oval shape of pattern 44. Rather, what is meant by protuberance and indentation is a local discontinuity or deviation from the general shape of the perimeter of the pattern.

Other advantageous patterns (not shown) could include multiple islands each having many DUT arrays with no main or coherent perimeter in the overall probe head pattern, with one or more islands having their own openings, indentations and /or protuberances.

In another aspect of the invention, a symmetrical pattern, such as a parallelogram or other symmetrical pattern could include DUT arrays in lines that are not parallel with any of the horizontal or vertical lines of DUTs on a semiconductor wafer.

It is important to realize that the patterns shown can be built up out of multiple probe heads, such as described in U.S. Pat. No. 5,806,181, which is incorporated in its entirety herein by reference. It also is the case that other methods of probe card or wafer contactor construction, including the use of tungsten needles, buckling beam or "cobra" like contacts, MEMs structures, membrane probes or the other suitable structures can be arranged in similar patterns with similar benefits. The patterns are not limited to use on probe heads testing electronic dies on silicon wafers, but can be applied to any contactor having an array of contacts for making repeatable contact with devices for any purpose, such as for "burn-in" or testing.

Having described and illustrated the principles of the invention in a preferred embodiment thereof, it should be apparent that the invention can be modified in arrangement and detail without departing from such principles. We claim all modifications and variation coming within the spirit and scope of the following claims.

The invention claimed is:

1. A contactor for testing devices formed on a semiconductor wafer, the contactor comprising a probe array for making contact with pads formed on the devices, said probe array including contiguous DUT arrays disposed around an opening in the probe array, the opening being over at least one device when the probe array contacts the pads,
   wherein the contiguous DUT arrays are disposed to contact pads of a closed loop of adjacent ones of the devices,
   the opening corresponds to at least one of the devices disposed within the closed loop of adjacent ones of the devices, and
   the contiguous DUT arrays are configured to contact the devices of the closed loop of contiguous devices without contacting the at least one of the devices disposed within the closed loop of adjacent devices.

2. The contactor of claim 1 wherein said contiguous DUT arrays form a generally annular pattern.

3. The contactor of claim 1 wherein said opening in the DUT arrays is bounded by 4 DUT arrays.

4. The contactor of claim 1, wherein said probe array includes no more than 161 probe DUT arrays.

5. The contactor of claim 4, wherein said wafer includes at least 161 devices.

6. The contactor of claim 5, wherein said probe DUT arrays are configured to permit testing of all the devices on the wafer by placing the probe DUT array in contact with a first set of the pads of the devices, and then placing the probe DUT array in contact with a second set of the pads of the devices, no more than 28 of the devices containing pads in both the first and the second sets of pads.

7. The contactor of claim 1, wherein the probe array further includes additional DUT arrays disposed within the opening.

8. The contactor of claim 7, wherein the additional DUT arrays include a pattern of contiguous ones of the additional DUT arrays disposed across the opening.

9. The contactor of claim 1, wherein the opening corresponds to a plurality of the devices disposed within the contiguous closed loop of adjacent ones of the devices.

10. The contactor of claim 1, wherein the devices are integrated circuit dies.

11. The contactor of claim 10, wherein each DUT array has sufficient probes to contact one of the devices.

12. An apparatus for testing devices formed on a semiconductor wafer, the apparatus comprising probe DUT arrays arranged in a closed loop pattern that includes at least one opening contained within a perimeter of the pattern in which there is no probe DUT array, wherein:
   the pattern of the probe DUT arrays corresponds to a pattern of a plurality of the devices,
   the closed loop corresponds to a closed loop of contiguous ones of the plurality of the devices,
   the opening corresponds to at least one of the devices located within the closed loop of contiguous devices, and
   the probe DUT arrays are configured to contact the devices of the closed loop of contiguous devices without contacting the at least one of the devices located within the closed loop of contiguous devices.

13. The apparatus of claim 12 wherein said pattern includes at least one additional opening contained within the perimeter of the pattern in which there is no probe DUT array.

14. The apparatus of claim 12 wherein said pattern is generally annular.

15. The apparatus of claim 12 wherein said opening is bounded by 4 DUT arrays.

16. The apparatus of claim 12, wherein said probe DUT array includes no more than 161 probe DUT arrays.

17. The apparatus of claim 16, wherein said wafer includes at least 161 devices.

18. The apparatus of claim 17, wherein said probe DUT arrays are configured to permit testing of all the devices on the wafer by placing the probe DUT array in contact with a first set of pads of the devices, and then placing the probe DUT array in contact with a second set of pads of the devices, no more than 28 of the devices containing pads in both the first and the second sets of pads.

19. The apparatus of claim 12, wherein the devices are integrated circuit dies.

20. The apparatus of claim 12, wherein each probe DUT array has sufficient probes to contact one of the devices.

* * * * *